United States Patent [19]
Yang

[11] Patent Number: 6,055,195
[45] Date of Patent: Apr. 25, 2000

[54] DELAY CIRCUIT AND DELAY CHAIN CIRCUIT FOR MEASUREMENT OF THE CHARGE/DISCHARGE PERIOD OF DYNAMIC RANDOM ACCESS MEMORY

[75] Inventor: Shih-Hsien Yang, Tao-Yuan, Taiwan

[73] Assignee: Winbond Electronics Corp., Hsinchu, Taiwan

[21] Appl. No.: 09/306,131

[22] Filed: May 6, 1999

[30] Foreign Application Priority Data

Mar. 16, 1999 [TW] Taiwan ................................. 88104015

[51] Int. Cl.[7] ....................................................... G11C 7/00
[52] U.S. Cl. ........................... 365/194; 365/149; 327/153
[58] Field of Search ................................... 365/194, 149, 365/166; 327/152, 153, 158

[56] References Cited

U.S. PATENT DOCUMENTS 5,392,251  2/1995  Manning .................................. 365/194

Primary Examiner—Vu A. Le
Attorney, Agent, or Firm—Jiawei Huang; J. C. Patents

[57] ABSTRACT

A delay circuit is provided to dynamic random-access memory (DRAM) for use to assist the measurement of the DRAM charge/discharge period, which allows the DRAM charge/discharge period to be more precisely measured. In measurement, a plurality of such delay circuits are chained together to allow the charge/discharge period measurement to be performed in a collective manner on all the DRAM cells in the delay chain circuit, which can be then used to determine the charge/discharge period of each DRAM cell. When the charge or discharge process on the DRAM cell in the current stage is completed, the DRAM-cell delay circuit of the current stage will likewise generate an output voltage of a certain logic state to trigger the next stage to undergo a charge/discharge process. Furthermore, a large-current output driving circuit is coupled to the last stage in the delay chain circuit to allow an increased output driving capability.

29 Claims, 7 Drawing Sheets

DELAY CIRCUIT AND DELAY CHAIN CIRCUIT FOR MEASUREMENT OF THE CHARGE/DISCHARGE PERIOD OF DYNAMIC RANDOM ACCESS MEMORY

CROSS-REFERENCE TO RELATED APPLICATION

This application claims the priority benefit of Taiwan application serial no. 88104015, filed Mar. 16, 1999, the full disclosure of which is incorporated herein by reference.

BACKGROUND OF THE INVENTION

1. Field of the Invention

This invention relates to dynamic random access memory (DRAM) technology, and more particularly, to a delay circuit provided to each memory cell in a DRAM device for use to assist the measurement of the charge/discharge period of each DRAM cell more precisely. Moreover, the invention relates to a delay chain circuit which is formed by chaining a plurality of such delay circuits together to allow the charge/discharge period measurement to be performed in a collective manner on all the DRAM cells in the delay chain circuit, which can be then used to determine the charge/discharge period of each DRAM cell.

2. Description of Related Art

As integrated circuit technology advances, the fabrication of DRAMs has now entered into the deep-submicrometer and nanometer levels of integration and the DRAM operation speed is now at sub-nano-second levels. At such fast operation speeds, however, the parasite resistance in a DRAM device would become nonnegligible, which would then adversely affect the performance of the DRAM device.

Fundamentally, each DRAM cell includes a capacitor, called data-storage capacitor, to store binary data in such a manner that when the data-storage capacitor is charged, it represents the storage of a first binary value, for example 1; and when discharged, it represents the storage of a second binary value, for example 0. In DRAMs that use a deep-trench capacitor, the buried strap would be very high in electrical resistance, thus reducing the operating current in the access operation to the DRAM, causing the data stored on the capacitor to be easily lost when the switching speed on the word lines is very fast. The access speed to the DRAM is therefore limited by this factor. Accordingly, in the design of DRAMs, it is required to measure the DRAM charge/discharge period precisely.

FIG. 1 is a schematic diagram showing the equivalent circuit of a conventional DRAM cell As shown, the conventional DRAM cell includes a MOS transistor TMC, a buried-strap resistor RBS, a deep-trench resistor RDT, a data-storage capacitor CDT, and a poly-contact resistor RCB. The MOS transistor TMC has a gate connected to a word line to receive a gate voltage VGin, a first source/drain end connected via the poly-contact resistor RCB to receive a system voltage VCC, and a second source/drain end connected via the buried-strap resistor RBS and the deep-trench resistor RDT to the data-storage capacitor CDT. The other end of the data-storage capacitor CDT is connected to a buried-plate voltage VBP. The system voltage VCC is used to represent a high-voltage logic state for the DRAM, while the buried-plate voltage VBP is used to represent a low-voltage logic state for the DRAM.

One drawback to the foregoing DRAM cell structure, however, is that it would be impossible to measure the voltage variation at the data-storage capacitor CDT from the storage node in the DRAM cell. This is because that the connection pads in the DRAM has a very high capacitance that would significantly affect the access speed to the DRAM cell; and in addition, the DRAM charge/discharge period is too short to allow precise measurement.

SUMMARY OF THE INVENTION

It is at least an objective of the present invention to provide a DRAM-cell delay circuit for use to assist the measurement of the DRAM charge/discharge period more precisely.

It is at least another objective of the present invention to provide a delay chain circuit which is formed by chaining a plurality of above-mentioned DRAM-cell delay circuits for measurement of the charge/discharge period of each DRAM cell by measuring the overall charge/discharge period of the entire delay chain circuit, so that the charge/discharge period of each DRAM cell can be measured more precisely.

In accordance with the foregoing and other objectives of this invention, a delay circuit and a delay chain circuit are provided for measurement of the charge/discharge period of each DRAM cell in a DRAM device.

The DRAM-cell delay circuit of the invention includes a plurality of external connecting ports, such as seven connecting ports. A first external connecting port receives an externally-supplied gate voltage. A second external connecting port receives an externally-supplied first system voltage representing a high-voltage logic state. A third external connecting port receives an externally-supplied buried-plate voltage representing a low-voltage logic state. A fourth external connecting port receives an externally-supplied second system voltage representing a high-voltage logic state. A fifth external connecting port is connected to a ground reference voltage, representing a low-voltage logic state. A sixth external connecting port receives an externally-supplied switching signal. A seventh external connecting port serves as an output port for the DRAM-cell delay circuit.

The DRAM-cell delay circuit of the invention can be connected to a successive identical one of the DRAM-cell delay circuit in series through the first and the seventh external connecting ports. After a previous circuit completes its function of charge/discharge, the previous circuit produces an output voltage for the successive circuit as an input voltage, and a delay time depends the number of the DRAM-cell delay circuit being used in series.

The invention uses several DRAM-cell delay circuits, which are coupled in cascade, to sequentially charge/discharge the DRAM-cells. The DRAM-cell delay circuits are activated one after one with a delay time, which depends on each time of the measurements. By measuring the voltage level of the DRAM-cell delay circuits, the total time used between the first DRAM-cell delay circuit and the last DRAM-cell delay circuit being all ON/OFF can be precisely measured.

The DRAM-cell delay circuit of the invention further includes a DRAM-cell unit circuit, which includes a memory transistor, a data-storage capacitor, a resistor. The memory transistor has a gate connected to the first external connecting port, a first source/drain end connected to the second external connecting port, and a second source/drain end connected to an output node. The resistor has a first end and a second end, with the first end being connected to the output node. The data-storage capacitor has a first end and a second end, with the first end being connected to the second end of the resistor and the second end being connected to the third external connecting port.

Moreover, the DRAM-cell delay circuit includes a first pass transistor and a second pass transistor. The first pass transistor has a gate, a first source/drain end, and a second source/drain end, with the gate of the first pass transistor being connected to the sixth external connecting port. The second pass transistor has a gate, a first source/drain end, and a second source/drain end, with the first source/drain end of the second pass transistor being connected to the output node of the DRAM cell.

Furthermore, the DRAM-cell delay circuit includes a first inverter, a second inverter, and a third inverter. The first inverter has an input end and an output end, with the input end of the first inverter being connected to the output node of the DRAM cell and the output end of the first inverter being connected to the first source/drain end of the first pass transistor. The first inverter is capable of inverting the logic state of the input signal thereto. The second inverter has an input end and an output end, with the input end of the second inverter being connected to the sixth external connecting port and the output end of the second inverter being connected to the gate of the second pass transistor. The second inverter is capable of inverting the logic state of the input signal thereto. The third inverter has an input end and an output end, with the input end of the third inverter being connected to both the second source/drain end of the first pass transistor and the second source/drain end of the second pass transistor, and the output end of the third inverter being connected to the seventh external connecting port. The third inverter is capable of inverting the logic state of the input signal thereto.

The objectives of the invention can be achieved in the measurement by chaining several such delay circuits together in series through the first and the seventh connecting ports to obtain a large current driving ability, which employs a driving circuit for the output of the invention. The DRAM cells undergo the charge/discharge period measurement successively. In the manner of the invention, when the measurement on one DRAM cell is completed, the associated delay circuit will produce an output voltage to the next stage so as to regularly drive the next stage to undergo a charge/discharge process for charge/discharge period measurement. In conclusion, the charge/discharge period of each DRAM cell can be determined by first detecting the overall charge/discharge period of the delay chain circuit minus the overall delay by the inverters and then dividing it by the number of chained stages of DRAM-cell delay circuits.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

In accordance with the invention, a delay circuit is provided to each memory cell in a DRAM device for use to assist the measurement of the charge/discharge period of the associated DRAM cell. During the measurement, a plurality of such delay circuits are chained together to form a delay chain circuit to allow the charge/discharge period measurement to be performed in a collective manner on all the DRAM cells in the delay chain circuit, which can be then used to determine the charge/discharge period of each DRAM cell. Various preferred embodiments of the invention are disclosed in the following with reference to the accompanying drawings.

Delay Circuit of the Invention

Figure 1:
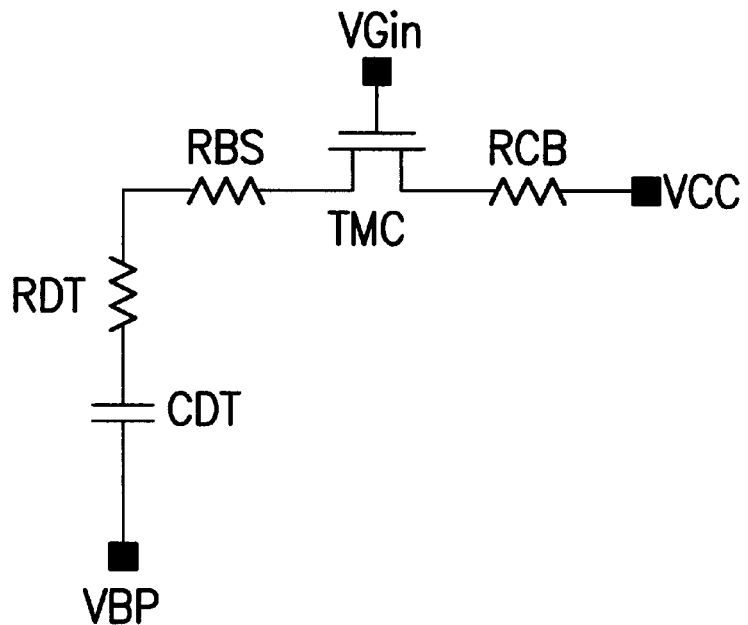
FIG. 1 is a schematic diagram showing the equivalent circuit of a conventional DRAM cell.
Figure 2:
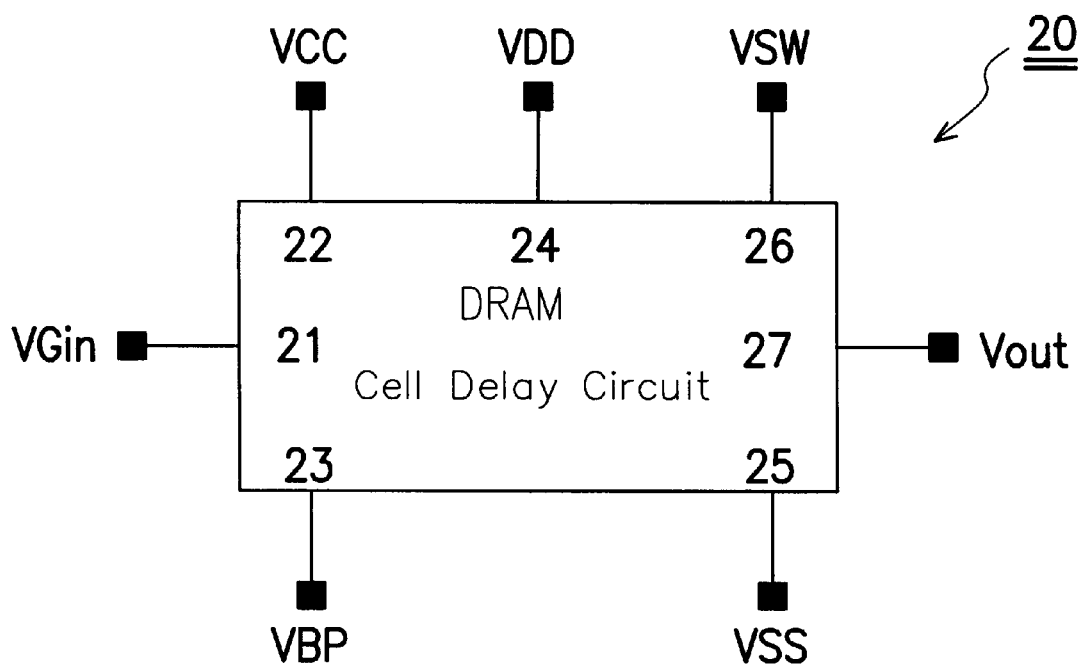
FIG. 2 is a schematic diagram of the external connecting ports on the DRAM-cell delay circuit according to the invention.

FIG. 2 is a schematic diagram of the external connecting ports on the DRAM-cell delay circuit according to the invention. The DRAM-cell delay circuit is here designated by the reference numeral 20. As shown, the DRAM-cell delay circuit 20 includes a total of seven external connecting ports: a first external connecting port (VGin) 21, a second external connecting port (VCC) 22, a third external connecting port (VBP) 23, a fourth external connecting port (VDD) 24, a fifth external connecting port (VSS) 25, a sixth external connecting port (VSW) 26, and a seventh external connecting port (Vout) 27. The first external connecting port (VGin) 21 is connected to an externally-supplied gate voltage VGin; the second external connecting port (VCC) 22 is connected to an externally-supplied first system voltage VCC which represents a high-voltage logic state; the third external connecting port (VBP) 23 is connected to a buried-plate voltage VBP which represents a low-voltage logic state; the fourth external connecting port (VDD) 24 is connected to an externally-supplied second system voltage VDD which represents a high-voltage logic state; the fifth external connecting port (VSS) 25 is connected to a ground reference voltage VSS which represents a low-voltage logic state; the sixth external connecting port (VSW) 26 is connected to an externally-generated switching signal VSW; and the seventh external connecting port (Vout) 27 is used to serve an output port for the output voltage Vout from this DRAM-cell delay circuit 20.

The DRAM-cell delay circuit 20 of FIG. 2 can be realized by the following various embodiments.

Figure 3:
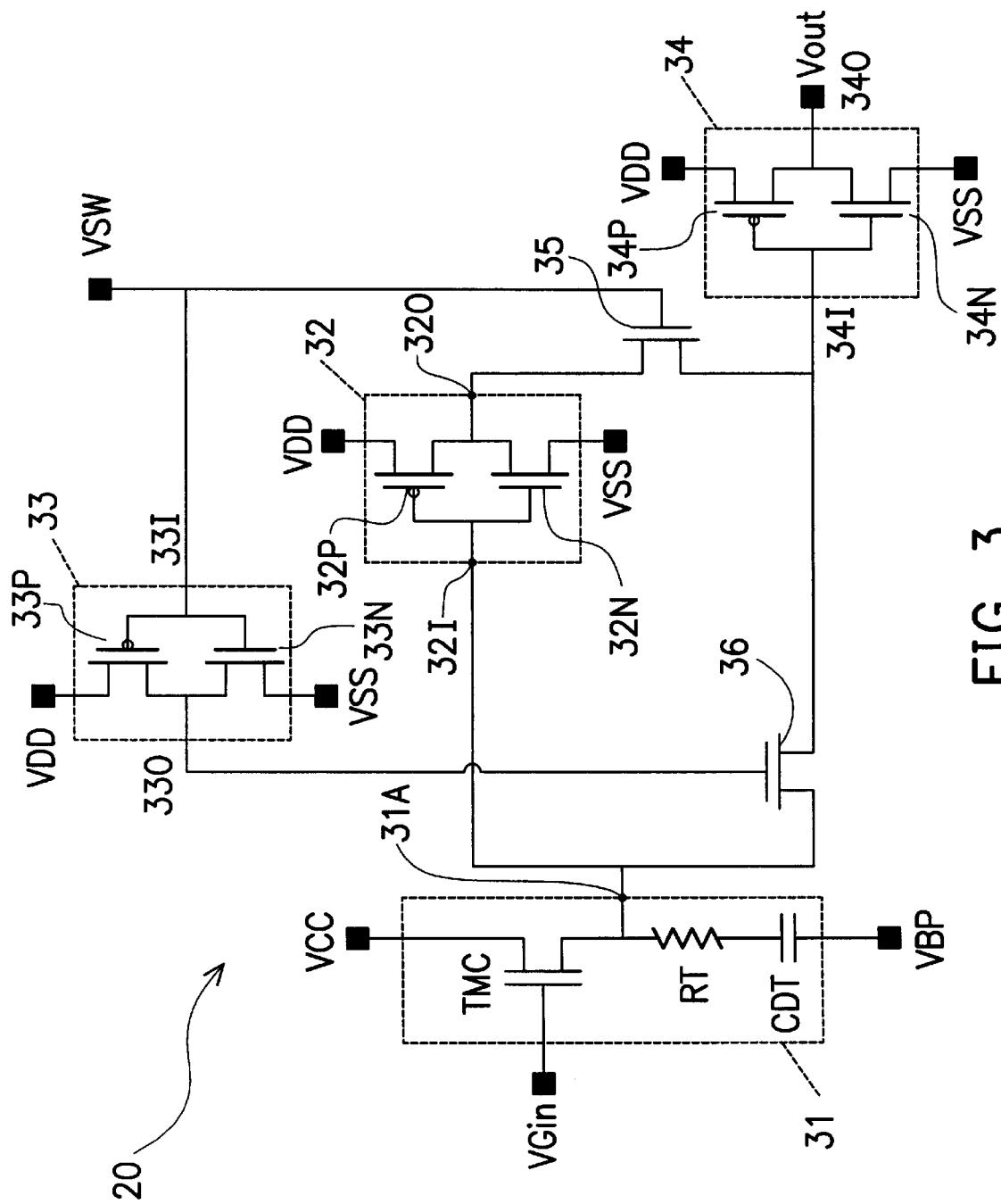
FIG. 3 is a schematic diagram showing a first preferred embodiment of the inside structure of the DRAM-cell delay circuit of FIG. 2.

First Preferred Embodiment of the Delay Circuit (FIG. 3)

Referring to FIG. 3 together with FIG. 2, the first preferred embodiment of the DRAM-cell delay circuit 20 shown in FIG. 2 includes a DRAM cell 31, a first inverter 32, a second inverter 33, and a third inverter 34, a first pass transistor 35, and a second pass transistor 36.

The DRAM cell 31 is composed of a MOS transistor TMC, a resistor RT, and a data-storage capacitor CDT. The MOS transistor TMC has a gate connected to the first external connecting port (VGin) 21 (FIG. 2) to receive an externally-supplied gate voltage VGin, a first source/drain end connected to the second external connecting port (VCC) 22 to receive an externally-supplied system voltage VCC, and a second source/drain end connected to an output node

31A. The resistor RT has a first end connected to the output node 31A and a second end connected in series to the data-storage capacitor CDT. The other end of the data-storage capacitor CDT is connected to the third external connecting port (VBP) 23 (FIG. 2) for connection to a buried-plate voltage VBP.

The first inverter 32 has an input end 32I and an output end 32O, with the input end 32I being connected to the output node 31A of the DRAM cell 31 and the output end 32O being connected to one source/drain end of the first pass transistor 35. The first inverter 32 is composed of a PMOS transistor 32P and an NMOS transistor 32N. The PMOS transistor 32P has a gate connected to the input end 32I of the first inverter 32; a first source/drain end connected to VDD; and a second source/drain end connected to the output end 32O of the first inverter 32. The NMOS transistor 32N has a gate connected to the input end 32I of the first inverter 32; a first source/drain end connected to VSS; and a second source/drain end connected to the output end 32O of the first inverter 32.

The second inverter 33 has an input end 33I connected to VSW and an output end 33O connected to the gate of the second pass transistor 36. The second inverter 33 is composed of a PMOS transistor 33P and an NMOS transistor 33N. The PMOS transistor 33P has a gate connected to the input end 33I of the second inverter 33; a first source/drain end connected to VDD; and a second source/drain end connected to the output end 33O of the second inverter 33. The NMOS transistor 33N has a gate connected to the input end 33I of the second inverter 33; a first source/drain end connected to VSS; and a second source/drain end connected to the output end 33O of the second inverter 33.

The third inverter 34 has an input end 34I and an output end 34O, with the input end 34I being connected to both the second source/drain end of the first pass transistor 35 and the second source/drain end of the second pass transistor 36, and with the output end 34O being connected to the seventh external connecting port (Vout) 27 (FIG. 2). The third inverter 34 is composed of a PMOS transistor 34P and an NMOS transistor 34N. The PMOS transistor 34P has a gate connected to the input end 34I of the third inverter 34; a first source/drain end connected to VDD; and a second source/drain end connected to the output end 34O of the third inverter 34. The NMOS transistor 34N has a gate connected to the input end 34I of the third inverter 34; a first source/drain end connected to VSS; and a second source/drain end connected to the output end 34O of the third inverter 34, The first pass transistor 35 has a gate connected to VSW, a first source/drain end connected to the output end 32O of the first inverter 32, and a second source/drain end connected to the input end 34I of the third inverter 34.

The second pass transistor 36 has a gate connected to the output end 33O of the second inverter 33, a first source/drain end connected to the output node 31A of the DRAM cell 31, and a second source/drain end connected to the input end 34I of the third inverter 34.

In operation, when the switching signal VSW is switched to high-voltage logic state (in this preferred embodiment, equal to VDD), it will cause the first pass transistor 35 to be switched ON and the second pass transistor 36 to be switched OFF (since VSW is inverted by the second inverter 33 into low-voltage logic state); and in which condition, the output voltage at the output node 31A of the DRAM cell 31 is first inverted by the first inverter 32, then pass through the first pass transistor 35 (which is now being switched ON), and subsequently inverted by the third inverter 34 to serve as the output voltage Vout at the seventh external connecting port (Vout) 27. On the other hand, when the switching signal VSW is switched to low-voltage logic state (in this preferred embodiment, equal to VSS), it will cause the first pass transistor 35 to be switched OFF and the second pass transistor 36 to be switched ON (since VSW is inverted by the second inverter 33 into low-voltage logic state); and in which condition, the output voltage at the output node 31A of the DRAM cell 31 will pass through the second pass transistor 36 (which is now being switched ON) and subsequently inverted by the third inverter 34 to serve as the output voltage Vout at the seventh external connecting port (Vout) 27.

During the initialization for discharge period measurement, the system voltage VCC is set to high-voltage logic state so as to charge the data-storage capacitor CDT in the DRAM cell 31. When the data-storage capacitor CDT is fully charged, it causes the output node 31A of the DRAM cell 31 to be set at high-voltage logic state. Subsequently, when the DRAM cell 31 starts to discharge, the gate voltage VGin is switched from low-voltage logic state to high-voltage logic state, while the switching signal VSW is set to low-voltage logic state. Under this condition, when the discharge is completed, the voltage at the output node 31A is switched from high-voltage logic state to low-voltage logic state, thus causing the generation of a low-voltage signal which then passes through the second pass transistor 36 (which is now being switched ON by VSW) and subsequently inverted by the third inverter 34 into high-voltage logic state. As a result, the output voltage Vout at the seventh external connecting port (Vout) 27 is set to high-voltage logic state.

On the other hand, during the initialization for charge period measurement, the system voltage VCC is set to low-voltage logic state so as to discharge the data-storage capacitor CDT in the DRAM cell 31. When the data-storage capacitor CDT is fully discharged, it causes the output node 31A of the DRAM cell 31 to be set at low-voltage logic state. When the DRAM cell 31 starts to charge, the gate voltage VGin is switched from low-voltage logic state to high-voltage logic state, while the switching signal VSW is set to high-voltage logic state. Under this condition, when the charge is completed, the voltage at the output node 31A is switched from low-voltage logic state to high-voltage logic state, thus causing the generation of a low-voltage signal which is then inverted by the first inverter 32, subsequently passes through the first pass transistor 35 (which is now being switched ON by VSW), and then inverted by the third inverter 34 back into high-voltage logic state. As a result, the output voltage Vout at the seventh external connecting port (Vout) 27 is set to high-voltage logic state.

It can be learned from the foregoing description that, whether the DRAM cell 31 undergoes a charge process or a discharge process, the seventh external connecting port (Vout) 27 will be likewise set to high-voltage logic state after the charge or discharge process is completed. Therefore, the output voltage Vout at the seventh external connecting port (Vout) 27 of the DRAM-cell delay circuit 20 can be used as a trigger signal indicative of the completion of the charge/discharge process on the DRAM cell 31.

Figure 4:
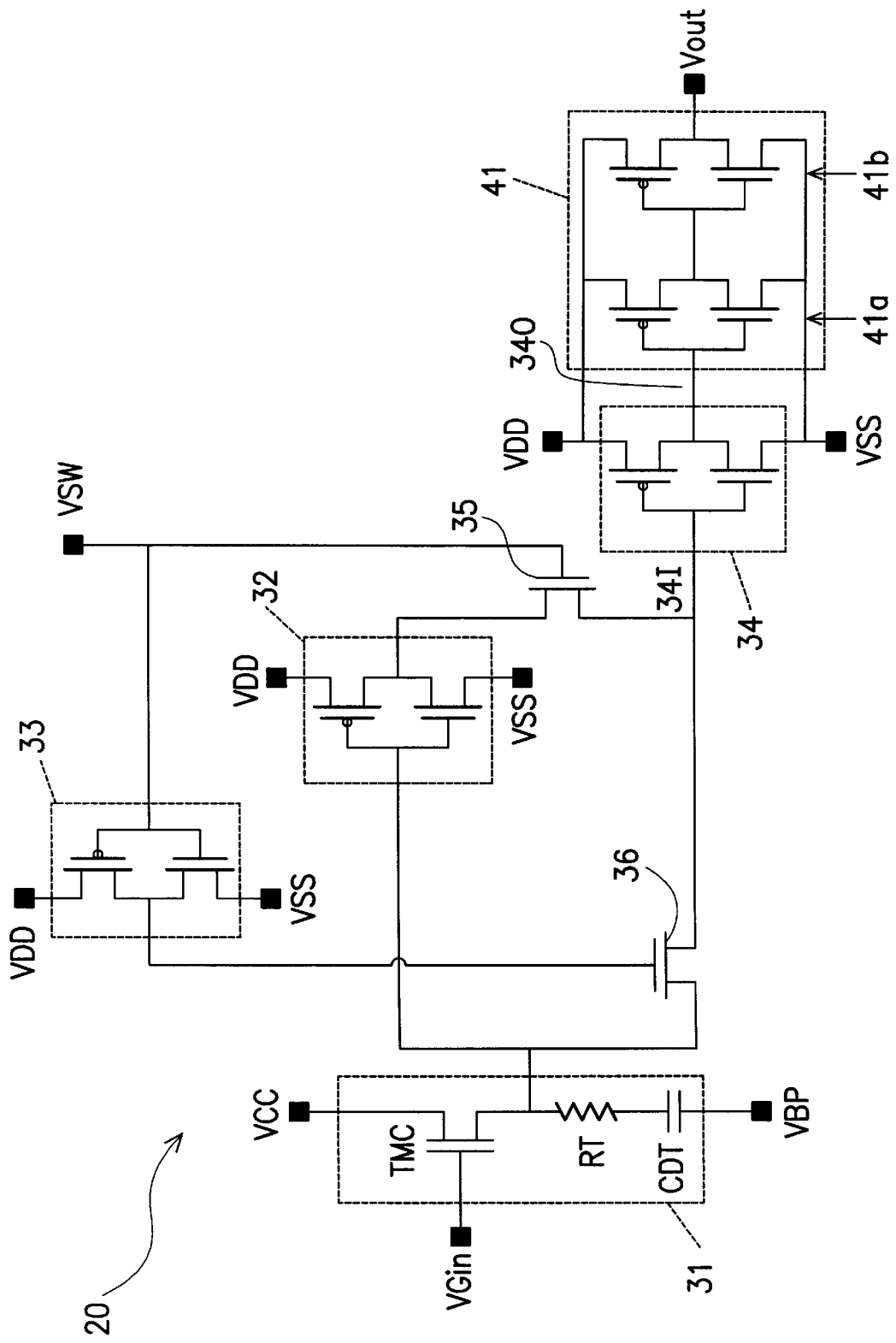
FIG. 4 is a schematic diagram showing a second preferred embodiment of the inside structure of the DRAM-cell delay circuit of FIG. 2.

Second Preferred Embodiment of the Delay Circuit (FIG. 4)

A second preferred embodiment of the DRAM-cell delay circuit 20 shown in FIG. 2 is disclosed in the following with reference to FIG. 4. In FIG. 4, those elements that are identical in structure and function as those in the previous embodiment of FIG. 3 are labeled with the same reference numerals and description thereof will not be repeated herein.

As shown in FIG. 4, the second preferred embodiment differs from the previous one only in the addition of a large-current output driving circuit 41 to the output end 34O of the third inverter 34 for the purpose of increasing the magnitude of the output voltage Vout of the DRAM-cell delay circuit 20 (the output end of the output driving circuit 41 is here used in lieu of the output end 34O of the third inverter 34 to serve as the output end of the DRAM-cell delay circuit 20). The output driving circuit 41 is composed of a pair of cascaded large inverters 41a, 41b. The first inverter 41a has an input end connected to the output end 34O of the third inverter 34 and an output end connected to the input end of the second inverter 41b; and the second inverter 41b has an input end connected to the output end of the first inverter 41a and an output end connected to the seventh external connecting port (Vout) 27 (FIG. 2) to serve as the output end of the DRAM-cell delay circuit 20 for Vout. This output driving circuit 41 has a large current driving capability that allows a larger and more stable output voltage Vout, allowing the output voltage Vout to be sufficient to drive the subsequent stage of circuit.

Figure 5:
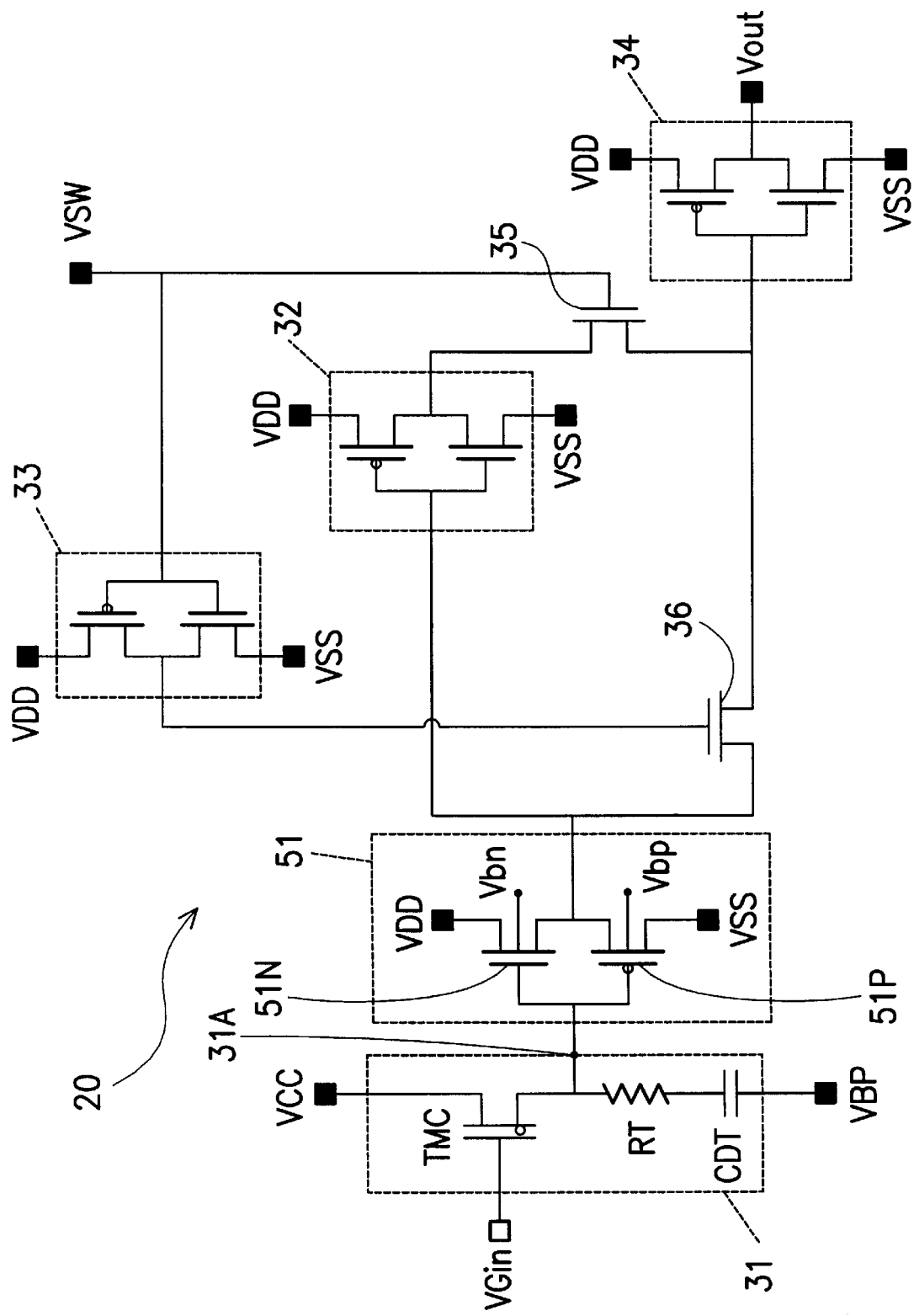
FIG. 5 is a schematic diagram showing a third preferred embodiment of the inside structure of the DRAM-cell delay circuit of FIG. 2.

Third Preferred Embodiment of the Delay Circuit (FIG. 5)

A third preferred embodiment of the DRAM-cell delay circuit 20 shown in FIG. 2 is disclosed in the following with reference to FIG. 5. In FIG. 5, those elements that are identical in structure and function as those in the previous embodiment of FIG. 3 are labeled with the same reference numerals and description thereof will not be repeated herein.

As shown in FIG. 5, the third preferred embodiment differs from the first one shown in FIG. 3 in the addition of a trigger-voltage control gate 51 to the output node 31A of the DRAM cell 31. With this trigger-voltage control gate 51, the logic state of the switching signal VSW remains the same as that of the first embodiment for proper control of the DRAM-cell delay circuit 20 of this embodiment. The trigger-voltage control gate 51 has an input end connected to the output node 31A of the DRAM cell 31 and an output end connected to both the input end of the first inverter 32 and the first source/drain end of the second pass transistor 36. The trigger-voltage control gate 51 is composed of a PMOS transistor 51P and an NMOS transistor 51N. The PMOS transistor 51P has a substrate connected to a first bias voltage Vbp, a gate connected to the output node 31A of the DRAM cell 31, a first source/drain end connected to VSS, and a second source/drain end connected to the output end of the trigger-voltage control gate 51. The NMOS transistor 51N has a substrate connected to a second bias voltage Vbn, a gate connected to the output node 31A of the DRAM cell 31, a first source/drain end connected to VDD, and a second source/drain end connected to the output end of the trigger-voltage control gate 51. With this trigger-voltage control gate 51, the first bias voltage Vbp and the second bias voltage Vbn can be independently controlled to vary the output trigger voltage generated by the trigger-voltage control gate 51. This can help eliminate the charge distribution issue at the data-storage capacitor CDT and the input end of the first inverter 32 in the DRAM-cell delay circuit 20 of FIG. 3.

The trigger-voltage control gate 51 operates in such a manner that, when its input end is set to high-voltage logic state (i.e., equal to VCC), its output end will output VDD-Vtn, where Vtn is the threshold voltage of the NMOS transistor 51N; and when its input end is set to low-voltage logic state (i.e., equal to VSS), its output end will output VSS+Vtp, where Vtp is the threshold voltage of the PMOS transistor 51P.

Delay Chain Circuit of the Invention

Figure 6:
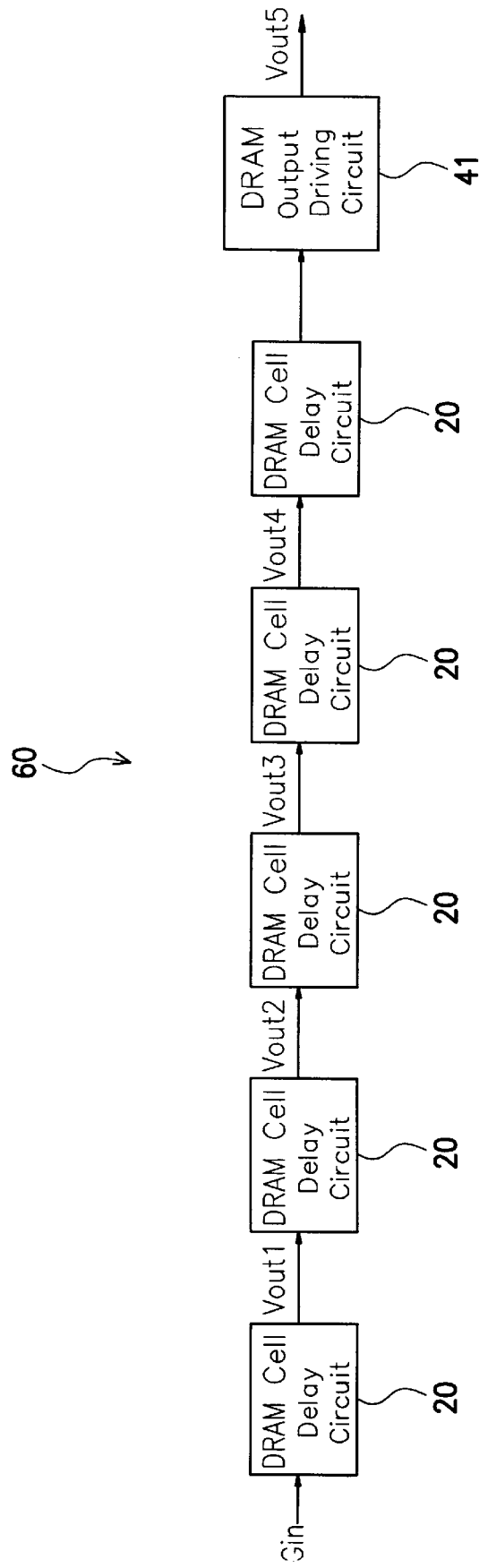
FIG. 6 is a schematic block diagram of the delay chain circuit according to the invention.

FIG. 6 is a schematic block diagram of a delay chain circuit which is formed by chaining a plurality of DRAM-cell delay circuits, each of which is served by the above-mentioned DRAM-cell delay circuit 20, and coupling the last stage with an output driving circuit 41. The DRAM-cell delay circuits 20 are chained in such a manner that the seventh external connecting port (Vout) 27 of each stage is connected to the first external connecting port (VGin) 21 of the next stage. In FIG. 7, the respective output voltages from the first, second, third, and fourth stages are denoted by $V_{out1}$, $V_{out2}$, $V_{out3}$, and $V_{out4}$, respectively; and the output voltage from the output driving circuit 41 coupled to the last stage is denoted by $V_{out5}$.

Figure 7A:
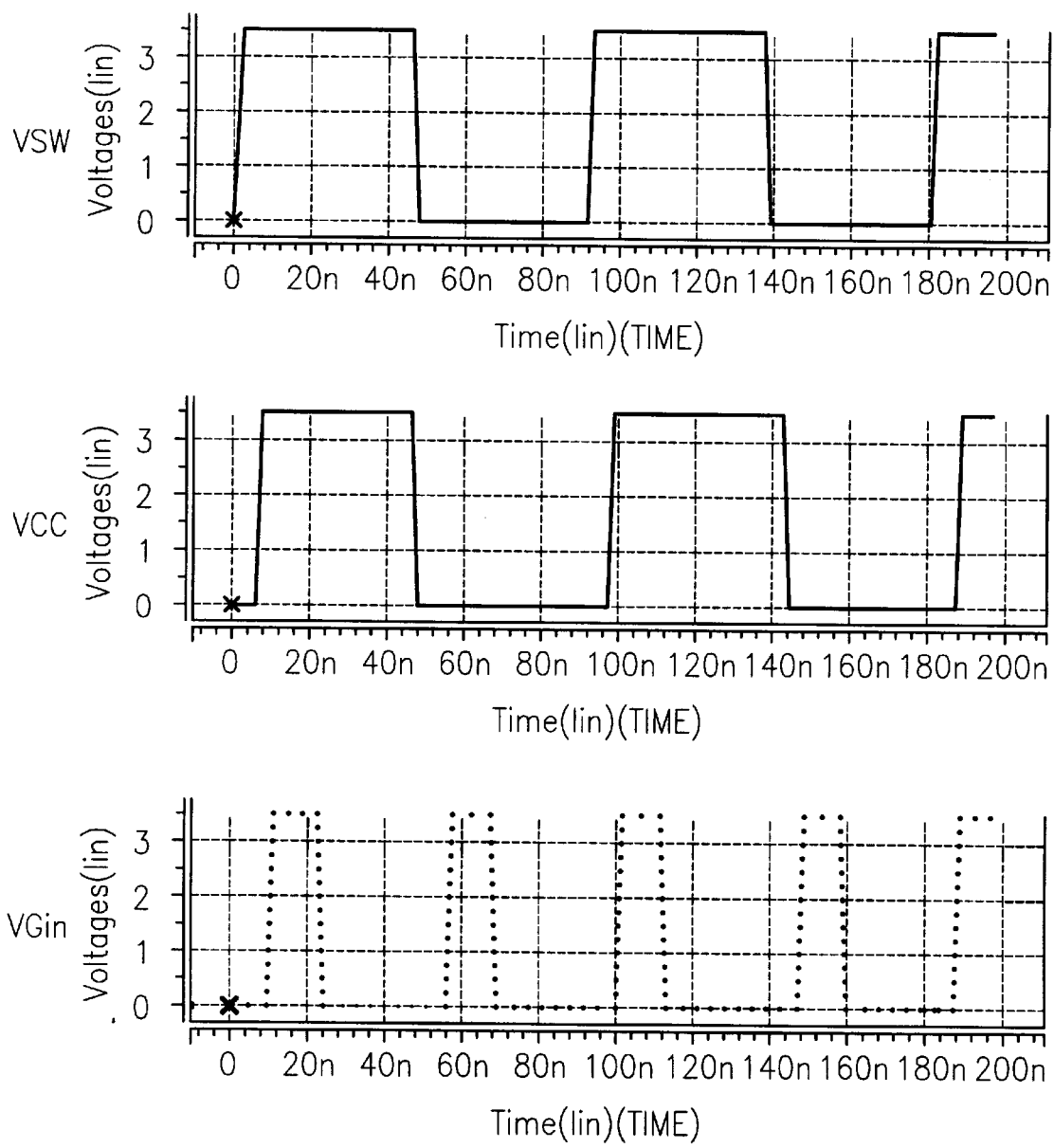
FIG. 7A is a waveform diagram showing the timings between various voltage signals in the delay chain circuit of FIG. 6.
Figure 7B:
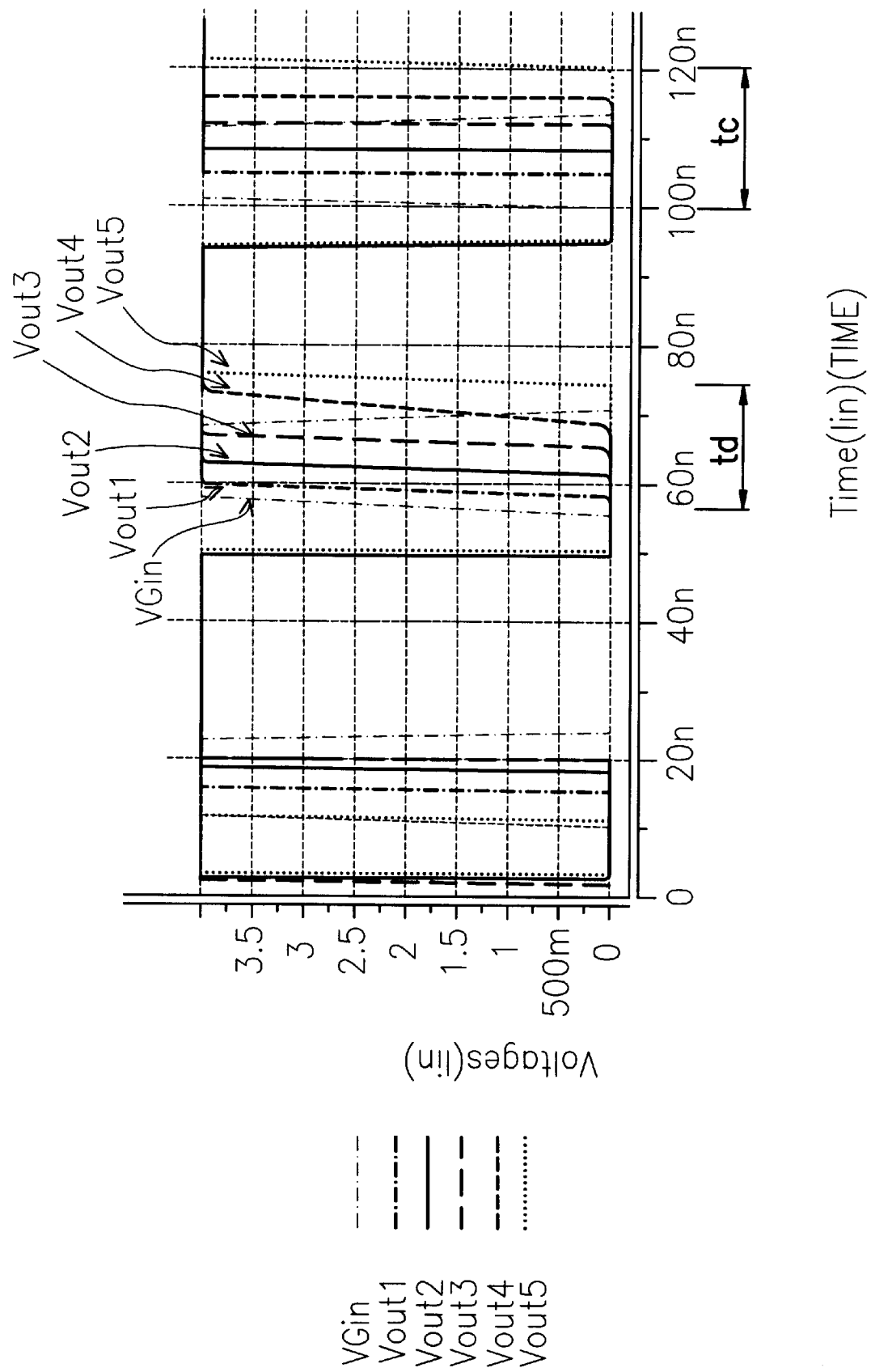
FIG. 7B is a waveform diagram showing the waveforms of various voltage signals in the delay chain circuit of FIG. 6.

FIG. 7A is a waveform diagram showing the timings between VSW, VCC, and VGin in the delay chain circuit 60 of FIG. 6, and FIG. 7B is a waveform diagram showing the waveforms of VGin, $V_{out1}$, $V_{out2}$, $V_{out3}$, $V_{out4}$, and $V_{out5}$. During initialization, the respective data-storage capacitors in the five DRAM-cell delay circuits 20 (i.e., the data-storage capacitor CDT shown in FIGS. 3, 4, and 5) are set to 1 V, 0 V, 0.5 V, 1 V, and 2 V respectively. During the period from 0 ns to 40 ns, all these data-storage capacitors CDT are precharged to high-voltage logic state. Subsequently during the period from 50 ns to 80 ns, all these data-storage capacitors CDT are discharged to low-voltage logic state. Assume the required period to complete this discharge process is $t_d$. Subsequently during the period from 100 ns to 130 ns, all these data-storage capacitors CDT are again charged to high-voltage logic state. Assume the required period to complete this discharge process is $t_c$ and the total delay time by all the inverters in the delay chain circuit 60 is $t_i$. It can be deduced that each DRAM cell in the delay chain circuit 60 requires a discharge period of $(t_d-t_i)/5$ and a charge period of $(t_c-t_i)/5$. In conclusion, the charge/discharge period of each DRAM cell can be determined by first detecting the overall charge/discharge period of the delay chain circuit minus the overall delay by the inverters and then dividing it by the number of chained stages of DRAM-cell delay circuits.

In each of the inverters in the delay chain circuit 60 (i.e., the first inverter 32, second inverter 33, and the third inverter 34), the NMOS transistor has a channel width-to-length ratio $(W_n/L_n)$ of 10 $\mu$m/0.25 $\mu$m, and the PMOS transistor has a channel width-to-length ratio $(W_p/L_p)$ of 2 $\mu$m/0.45 $\mu$m. Each inverter can cause of a delay of from 0.1 ns to 0.12 ns. The DRAM discharge period is about 3.4 ns, while the DRAM charge period is about 4 ns.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A DRAM-cell delay circuit, comprising:
    a plurality of external connecting ports including a first external connecting port for receiving an externally-supplied gate voltage, a second external connecting port for receiving an externally-supplied first system voltage representing a high-voltage logic state, a third external connecting port for receiving an externally-supplied buried-plate voltage representing a low-voltage logic state, a fourth external connecting port for receiving an externally-supplied second system voltage representing a high-voltage logic state, a fifth external connecting port for connecting to a ground reference voltage representing a low-voltage logic state, a sixth external connecting port for receiving an externally-supplied switching signal, and a seventh external connecting port for serving as an output port for the DRAM-cell delay circuit, wherein each the DRAM-cell delay circuit can be connected to a successive identical one of the DRAM-cell delay circuit in series through the first and the seventh external connecting ports, in which after the previous DRAM-cell delay circuit completes its function of charge/discharge, the previous DRAM-cell delay circuit produces an output voltage for the successive DRAM-cell delay circuit as an input voltage, and a delay time depends the number of the DRAM-cell delay circuit being used in series.

2. The DRAM-cell delay circuit of claim 1, wherein the circuit further comprises:

a DRAM cell including:
a MOS transistor having a gate connected to the first external connecting port, a first source/drain end connected to the second external connecting port, and a second source/drain end connected to an output node,
a resistor having a first end and a second end, with the first end being connected to the output node, and
a data-storage capacitor having a first end and a second end, with the first end being connected to the second end of the resistor and the second end being connected to the third external connecting port;

a first pass transistor having a gate, a first source/drain end, and a second source/drain end, with the gate of the first pass transistor being connected to the sixth external connecting port;

a second pass transistor having a gate, a first source/drain end, and a second source/drain end, with the first source/drain end of the second pass transistor being connected to the output node of the DRAM cell;

a first inverter having an input end and an output end, with the input end of the first inverter being connected to the output node of the DRAM cell and the output end of the first inverter being connected to the first source/drain end of the first pass transistor, and which is capable of inverting the logic state of the input signal thereto;

a second inverter having an input end and an output end, with the input end of the second inverter being connected to the sixth external connecting port and the output end of the second inverter being connected to the gate of the second pass transistor, and which is capable of inverting the logic state of the input signal thereto; and a third inverter having an input end and an output end, with the input end of the third inverter being connected to both the second source/drain end of the first pass transistor and the second source/drain end of the second pass transistor, and the output end of the third inverter being connected to the seventh external connecting port, and which is capable of inverting the logic state of the input signal thereto.

3. The DRAM-cell delay circuit of claim 2, wherein each of the first, second, and third inverters includes:

a PMOS transistor having a gate connected to the input end, a first source/drain end connected to the fourth external connecting port, and a second source/drain end connected to the output end; and an NMOS transistor having a gate tied to the gate of the PMOS transistor and connected to the input end, a first source/drain end connected to the fifth external connecting port, and a second source/drain end connected to the output end.

4. The DRAM-cell delay circuit of claim 1, wherein the first system voltage is equal in magnitude to the second system voltage.

5. The DRAM-cell delay circuit of claim 1, wherein the buried-plate voltage is equal in magnitude to the ground reference voltage.

6. The DRAM-cell delay circuit of claim 1, further comprising:

an output driving circuit, coupled to the output end of the third inverter, for providing an increased current driving capability to the output voltage from the third inverter.

7. The DRAM-cell delay circuit of claim 6, wherein the output driving circuit includes:

a first large inverter having an input end and an output end, with the input end being connected to the output end of the third inverter; and a second large inverter having an input end and an output end, with the input end being connected to the output end of the first large inverter, and with the output end serving as the output end of the DRAM-cell delay circuit.

8. The DRAM-cell delay circuit of claim 1, further comprising:

a trigger-voltage control gate having an input end and an output end, with the input end being connected to the output node of the DRAM cell and the output end being connected to both the input end of the first inverter and the first source/drain end of the second pass transistor.

9. The DRAM-cell delay circuit of claim 8, wherein the trigger-voltage control gate includes:

a PMOS transistor having a substrate connected to a first substrate bias voltage, a gate connected to the output node of the DRAM cell, a first source/drain end connected to the fifth external connecting port, and a second source/drain end connected to the output end of the trigger-voltage control gate; and an NMOS transistor having a substrate connected to a second substrate bias voltage, a gate connected to the output node of the DRAM cell, a first source/drain end connected to the fourth external connecting port, and a second source/drain end connected to the output end of the trigger-voltage control gate.

10. A DRAM-cell delay circuit for DRAM device, which comprises:

a DRAM cell including:
a MOS transistor having a gate connected to a first external connecting port for receiving an externally-supplied gate voltage, a first source/drain end connected to a second external connecting port for receiving an externally-supplied first system voltage representing a high-voltage logic state, and a second source/drain end connected to an output node,
a resistor having a first end and a second end, with the first end being connected to the output node, and
a data-storage capacitor having a first end and a second end, with the first end being connected to the second end of the resistor and the second end being connected to a third external connecting port for receiving an externally-supplied buried-plate voltage representing low-voltage logic state;

a first pass transistor having a gate, a first source/drain end, and a second source/drain end, with the gate of the first pass transistor being connected to a sixth external connecting port for receiving an externally-supplied switching signal;

a second pass transistor having a gate, a first source/drain end, and a second source/drain end, with the first source/drain end of the second pass transistor being connected to the output node of the DRAM cell;

a first inverter having an input end and an output end, with the input end of the first inverter being connected to the output node of the DRAM cell and the output end of the first inverter being connected to the first source/drain end of the first pass transistor, and which is capable of inverting the logic state of the input signal thereto;

a second inverter having an input end and an output end, with the input end of the second inverter being connected to the sixth external connecting port and the output end of the second inverter being connected to the gate of the second pass transistor, and which is capable of inverting the logic state of the input signal thereto; and a third inverter having an input end and an output end, with the input end of the third inverter being connected to both the second source/drain end of the first pass transistor and the second source/drain end of the second pass transistor, and the output end of the third inverter being connected to the output end of the DRAM-cell delay circuit, and which is capable of inverting the logic state of the input signal thereto.

11. The DRAM-cell delay circuit of claim 10, wherein the first, second, and third inverters each include:

a PMOS transistor having a gate connected to the input end, a first source/drain end connected to the fourth external connecting port, and a second source/drain end connected to the output end; and an NMOS transistor having a gate tied to the gate of the PMOS transistor and connected to the input end, a first source/drain end connected to the fifth external connecting port, and a second source/drain end connected to the output end.

12. The DRAM-cell delay circuit of claim 11, wherein the first system voltage is equal in magnitude to the second system voltage, and the buried-plate voltage is equal in magnitude to the ground reference voltage.

13. The DRAM-cell delay circuit of claim 10, further comprising:

an output driving circuit, coupled to the output end of the third inverter, for providing an increased current driving capability to the output voltage from the third inverter.

14. The DRAM-cell delay circuit of claim 13, wherein the output driving circuit includes:

a first large inverter having an input end and an output end, with the input end being connected to the output end of the third inverter; and a second large inverter having an input end and an output end, with the input end being connected to the output end of the first large inverter and the output end serving as the output end of the DRAM-cell delay circuit.

15. The DRAM-cell delay circuit of claim 10, further comprising:

a trigger-voltage control gate having an input end and an output end, with the input end being connected to the output node of the DRAM cell and the output end being connected to both the input end of the first inverter and the first source/drain end of the second pass transistor.

16. The DRAM-cell delay circuit of claim 15, wherein the trigger-voltage control gate includes:

a PMOS transistor having a substrate connected to a first substrate bias voltage, a gate connected to the output node of the DRAM cell, a first source/drain end connected to the fifth external connecting port, and a second source/drain end connected to the output end of the trigger-voltage control gate; and an NMOS transistor having a substrate connected to a second substrate bias voltage, a gate connected to the output node of the DRAM cell, a first source/drain end connected to the fourth external connecting port, and a second source/drain end connected to the output end of the trigger-voltage control gate.

17. A delay chain circuit for DRAM device, comprising:

an output driving circuit having an input end and an output end, with the output end of the output driving circuit serving as the output end of the delay chain circuit; and a plurality of chained DRAM-cell delay circuits, each having an input end and an output end, which are interconnected in such a manner that the output end of each stage of DRAM-cell delay circuit is connected to the input end of the next stage of DRAM-cell delay circuit; each DRAM-cell delay circuit including:

a plurality of external connecting ports, further including
  a first external connecting port for receiving an externally-supplied gate voltage,
  a second external connecting port for receiving an externally-supplied first system voltage representing a high-voltage logic state,
  a third external connecting port for receiving an externally-supplied buried-plate voltage representing a low-voltage logic state,
  a fourth external connecting port for receiving an externally-supplied second system voltage representing a high-voltage logic state,
  a fifth external connecting port for connecting to a ground reference voltage representing a low-voltage logic state,
  a sixth external connecting port for receiving an externally-supplied switching signal, and
  a seventh external connecting port for serving as an output port for the DRAM-cell delay circuit;

a DRAM cell further including:
  a MOS transistor having a gate connected to the first external connecting port, a first source/drain end connected to the second external connecting port, and a second source/drain end connected to an output node,
  a resistor having a first end and a second end, with the first end being connected to the output node, and
  a data-storage capacitor having a first end and a second end, with the first end being connected to the second end of the resistor and the second end being connected to the third external connecting port;

a first pass transistor having a gate, a first source/drain end, and a second source/drain end, with the gate of the first pass transistor being connected to the sixth external connecting port;

a second pass transistor having a gate, a first source/drain end, and a second source/drain end, with the first source/drain end of the second pass transistor being connected to the output node of the DRAM cell;

a first inverter having an input end and an output end, with the input end of the first inverter being connected to the output node of the DRAM cell and the output end of the first inverter being connected to the first source/drain end of the first pass transistor, and which is capable of inverting the logic state of the input signal thereto;

a second inverter having an input end and an output end, with the input end of the second inverter being connected to the sixth external connecting port and the output end of the second inverter being connected to the gate of the second pass transistor, and which is capable of inverting the logic state of the input signal thereto; and a third inverter having an input end and an output end, with the input end of the third inverter being connected to both the second source/drain end of the first pass transistor and the second source/drain end of the second pass transistor, and the output end of the third inverter being connected to the seventh external connecting port, and which is capable of inverting the logic state of the input signal thereto.

18. The delay chain circuit of claim 17, wherein the first system voltage is equal in magnitude to the second system voltage.

19. The delay chain circuit of claim 17, wherein the buried-plate voltage is equal in magnitude to the ground reference voltage.

20. The delay chain circuit of claim 19, wherein the first, second, and third inverters each include:

a PMOS transistor having a gate connected to the input end, a first source/drain end connected to the fourth external connecting port, and a second source/drain end connected to the output end; and an NMOS transistor having a gate tied to the gate of the PMOS transistor and connected to the input end, a first source/drain end connected to the fifth external connecting port, and a second source/drain end connected to the output end.

21. The delay chain circuit of claim 17, wherein the output driving circuit includes:

a first large inverter having an input end and an output end, with the input end being connected to the output end of the third inverter; and a second large inverter having an input end and an output end, with the input end being connected to the output end of the first large inverter and the output end serving as the output end of the DRAM-cell delay circuit.

22. The delay chain circuit of claim 17, wherein each delay circuit further comprises:

a trigger-voltage control gate having an input end and an output end, with the input end being connected to the output node of the DRAM cell and the output end being connected to both the input end of the first inverter and the first source/drain end of the second pass transistor.

23. The delay chain circuit of claim 22, wherein the trigger-voltage control gate includes:

a PMOS transistor having a substrate connected to a first substrate bias voltage, a gate connected to the output node of the DRAM cell, a first source/drain end connected to the fifth external connecting port, and a second source/drain end connected to the output end of the trigger-voltage control gate; and an NMOS transistor having a substrate connected to a second substrate bias voltage, a gate connected to the output node of the DRAM cell, a first source/drain end connected to the fourth external connecting port, and a second source/drain end connected to the output end of the trigger-voltage control gate.

24. A delay chain circuit for DRAM device, comprising:

an output driving circuit having an input end and an output end, with the output end of the output driving circuit serving as the output end of the delay chain circuit; and a plurality of chained DRAM-cell delay circuits, each having an input end and an output end, which are interconnected in such a manner that the output end of each stage of DRAM-cell delay circuit is connected to the input end of the next stage of DRAM-cell delay circuit; each DRAM-cell delay circuit including:

a DRAM cell including:

a MOS transistor having a gate connected to a first external connecting port for receiving an externally-supplied gate voltage, a first source/drain end connected to a second external connecting port for receiving an externally-supplied first system voltage representing high-voltage logic state, and a second source/drain end connected to an output node, a resistor having a first end and a second end, with the first end being connected to the output node, and a data-storage capacitor having a first end and a second end, with the first end being connected to the second end of the resistor and the second end being connected to a third external connecting port for receiving an externally-supplied buried-plate voltage representing low-voltage logic state;

a first pass transistor having a gate, a first source/drain end, and a second source/drain end, with the gate of the first pass transistor being connected to a sixth external connecting port for receiving an externally-supplied switching signal;

a second pass transistor having a gate, a first source/drain end, and a second source/drain end, with the first source/drain end of the second pass transistor being connected to the output node of the DRAM cell;

a first inverter having an input end and an output end, with the input end of the first inverter being connected to the output node of the DRAM cell and the output end of the first inverter being connected to the first source/drain end of the first pass transistor, and which is capable of inverting the logic state of the input signal thereto;

a second inverter having an input end and an output end, with the input end of the second inverter being connected to the sixth external connecting port and the output end of the second inverter being connected to the gate of the second pass transistor, and which is capable of inverting the logic state of the input signal thereto; and a third inverter having an input end and an output end, with the input end of the third inverter being connected to both the second source/drain end of the first pass transistor and the second source/drain end of the second pass transistor, and the output end of the third inverter being connected to the output end of the DRAM-cell delay circuit, and which is capable of inverting the logic state of the input signal thereto.

25. The delay chain circuit of claim 24, wherein the first, second, and third inverters each include:

a PMOS transistor having a gate connected to the input end, a first source/drain end connected to the fourth external connecting port, and a second source/drain end connected to the output end; and an NMOS transistor having a gate tied to the gate of the PMOS transistor and connected to the input end, a first source/drain end connected to the fifth external connecting port, and a second source/drain end connected to the output end.

26. The delay chain circuit of claim 25, wherein the first system voltage is equal in magnitude to the second system voltage, and the buried-plate voltage is equal in magnitude to the ground reference voltage.

27. The delay chain circuit of claim 24, wherein the output driving circuit includes:
- a first large inverter having an input end and an output end, with the input end being connected to the output end of the third inverter; and
- a second large inverter having an input end and an output end, with the input end being connected to the output end of the first large inverter and the output end serving as the output end of the DRAM-cell delay circuit.

28. The delay chain circuit of claim 24, wherein each DRAM-cell delay circuit further comprises:
- a trigger-voltage control gate having an input end and an output end, with the input end being connected to the output node of the DRAM cell and the output end being connected to both the input end of the first inverter and the first source/drain end of the second pass transistor.

29. The delay chain circuit of claim 28, wherein the trigger-voltage control gate includes:
- a PMOS transistor having a substrate connected to a first substrate bias voltage, a gate connected to the output node of the DRAM cell, a first source/drain end connected to the fifth external connecting port, and a second source/drain end connected to the output end of the trigger-voltage control gate; and
- an NMOS transistor having a substrate connected to a second substrate bias voltage, a gate connected to the output node of the DRAM cell, a first source/drain end connected to the fourth external connecting port, and a second source/drain end connected to the output end of the trigger-voltage control gate.

* * * * *